(12) United States Patent
Tsai et al.

(10) Patent No.: US 6,509,636 B1
(45) Date of Patent: Jan. 21, 2003

(54) SEMICONDUCTOR PACKAGE

(75) Inventors: Yueh-Ying Tsai, Taichung (TW);
Chin-Yuan Hung, Taichung (TW);
Chang-Fu Chen, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/039,251

(22) Filed: Jan. 2, 2002

(30) Foreign Application Priority Data

Nov. 15, 2001 (TW) .......................... 90128303 A

(51) Int. Cl.⁷ .......................... H01L 23/02; H01L 23/12
(52) U.S. Cl. .................. 257/678; 257/704; 257/783; 257/710
(58) Field of Search .................. 257/704, 783, 257/678, 710; 438/125, 118, 106, 121

(56) References Cited

U.S. PATENT DOCUMENTS 4,917,466 A * 4/1990 Nakamura et al. .......... 350/336
5,023,461 A * 6/1991 Nakazawa et al. .......... 250/484.1

FOREIGN PATENT DOCUMENTS

| JP | 64-57738 | * | 3/1989 | ................. 257/704 |
| JP | 1-199458 | * | 8/1999 | ................. 257/680 |

* cited by examiner

Primary Examiner—Jasmine J B Clark
(74) Attorney, Agent, or Firm—Peter F. Corless; Steven M. Jensen; Edwards & Angell, LLP

(57) ABSTRACT

A photosensitive semiconductor package with a lid is proposed, in which a chip carrier is formed with an encapsulant thereon, and the encapsulant is formed with a cavity for exposing a semiconductor chip mounted on the chip carrier. A top of the encapsulant is structured with a groove and at least a beveled portion that descends toward the groove and is associated with the groove. When a lid is attached onto the encapsulant by using an adhesive, the groove can temporarily retain excess adhesive with its flow being directed toward the groove by the beveled portion, so that undersirable adhesive loss and adhesive flash can both be prevented from occurrence, allowing the appearance of the semiconductor package to be well maintained.

15 Claims, 4 Drawing Sheets

SEMICONDUCTOR PACKAGE

FIELD OF THE INVENTION

The present invention relates to semiconductor packages, and more particularly, to a photosensitive semiconductor package with a lid.

BACKGROUND OF THE INVENTION

In a conventional semiconductor package, a semiconductor chip is encapsulated with an opaque encapsulant for preventing the chip from being damaged by external contaminant and moisture, as well as providing the chip with protection against damage from external impact. However, in respect of a photosensitive semiconductor chip for use in an electronic device such as CMOS image sensor, the chip can function properly only with its photosensitive side receiving external light. Therefore, it usually adopts a different method for packaging such a photosensitive semiconductor chip, as compared to the foregoing conventional semiconductor package.

Up to now, there have been several patents regarding the packaging of photosensitive semiconductor chips. A common semiconductor package 1 for accommodating a photosensitive semiconductor chip is illustrated in FIG. 1, comprising: a chip carrier 10 defined with a chip attach region 102; an encapsulant 12 formed on the chip carrier 10 with a cavity for exposing the chip attach region 102 by using a particular encapsulating mold during a molding process; a photosensitive semiconductor chip 15 adhered onto the chip attach region 102, and electrically connected to the chip carrier 10 by a plurality of conductive elements 16; and a transparent lid 13 attached to a top 121 of the encapsulant 12 in a manner that, the transparent lid 13 is positioned right above the photosensitive chip 15.

Generally, a commercially available transparent lid (such as a glass slice) is applied with an epoxy resin adhesive (such as b-stage glue) at positions to be attached to the top of the encapsulant. After heating and applying pressure, the adhesive melts and solidifies for firmly attaching the lid onto the top of the encapsulant.

However, due to variations of adhesive amount applied to the lid, and of dimensionally or structurally design of the encapsulant, the adhesive usually occurs to be positionally difficult in compliance with the top of the encapsulant. Referring again to FIG. 1, as the top 121 of the encapsulant 12 is flatly made, compression between the lid 13 and the top 121 of the encapsulant 12 easily results in the leakage or loss of the molten adhesive 14, making the adherence between the lid 13 and the encapsulant 12 undesirably damaged. Moreover, if the top 121 of the adhesive wall 12 is insufficiently dimensioned in adhering area, or the adhesive 14 is excessively applied, the molten adhesive 14 tends to flash over side walls of the encapsulant 12; this seriously damages the appearance of the semiconductor package 1. A solution is to form a dam (not shown) at an outer edge of the top 121 of the encapsulant 12. However, this can only eliminate the occurrence of adhesive flash over the outer side wall of the encapsulant 12, whereas the molten adhesive 14 still possibly leaks to the inner side wall of the encapsulant 12, and even contaminates the chip attach region 102.

SUMMARY OF THE INVENTION

A primary objective of the present invention is to provide a photosensitive semiconductor package with a lid, in which a groove in association with at least a beveled portion are formed on a top of an encapsulant for temporarily retaining excess adhesive, so as to eliminate the adhesive loss and the occurrence of adhesive flash over side walls of the encapsulant, thereby making the appearance of the semiconductor package well maintained.

In accordance with the foregoing and other objectives, the present invention proposes a photosensitive semiconductor package, comprising: a chip carrier, on which an encapsulant is formed with a cavity for exposing a portion of the chip carrier to outside of the encapsulant, wherein a top of the encapsulant is structured with a groove and at least a beveled portion that descends toward the groove and is associated with the groove; at least a semiconductor chip mounted in the cavity and on the exposed portion of the chip carrier, and electrically connected to the chip carrier; and a lid attached to the top of the encapsulant by an adhesive, for hermetically covering the cavity of the encapsulant so as to isolate the semiconductor chip from external atmosphere.

The photosensitive semiconductor package of the invention is characterized of adopting the groove in association with the beveled portion that is used for directing the adhesive flow toward the groove. Thereby, after the adhesive for attaching the lid to the encapsulant is melted by heating, the groove can temporarily retain excessive adhesive with its flow being directed toward the groove by the beveled portion, so that undesirable adhesive loss and adhesive flash can be both prevented from occurrence, making the appearance of the semiconductor package well maintained. In addition, the beveled portion is provided with a relatively larger surface area for accommodating the adhesive, allowing contact area to be increased between the top of the encapsulant and the adhesive, thereby effectively improving the bonding between the lid and the encapsulant.

BRIEF DESCRIPTION OF THE DRAWINGS

The present invention can be more fully understood by reading the following detailed description of the preferred embodiments with reference made to accompanying drawings, wherein.

DETAILED DESCRIPTIONS OF THE PREFERRED EMBODIMENTS

Three preferred embodiments of a photosensitive semiconductor package of the present invention are illustrated in detail as follows with the reference to FIGS. 2 to 8. It is understood that, the drawings are made in simplicity with provision of only associated elements related to the invention; in practical usage, the semiconductor package should be more complexly structured.

First Preferred Embodiment

Figure 1:
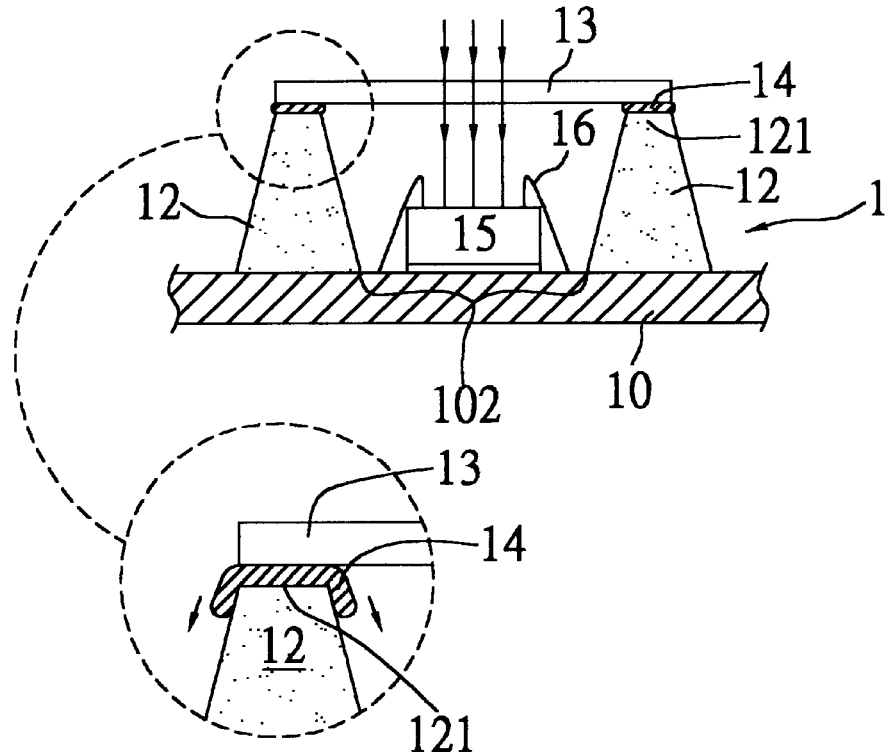
FIG. 1 is a cross-sectional view showing the adherence between a lid and a top of an encapsulant in a conventional photosensitive semiconductor package.
Figure 2:
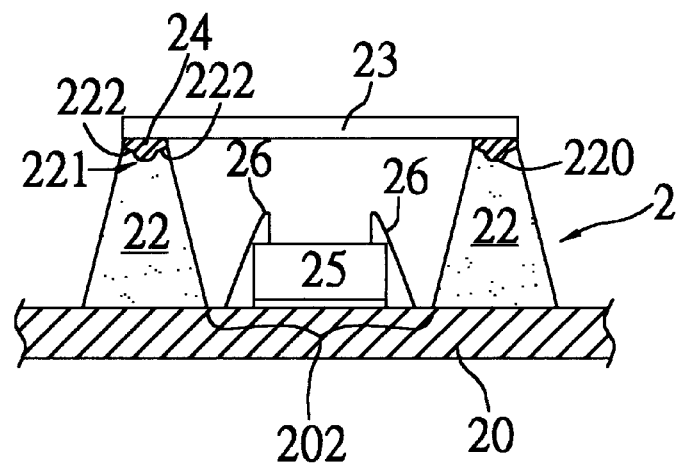
FIG. 2 is a cross-sectional view of a photosensitive semiconductor package of a first preferred embodiment of the invention.

FIG. 2 illustrates a first preferred embodiment of a photosensitive semiconductor package of the present invention. The semiconductor package 2 comprises a chip carrier 20 defined with a chip attach region 202; an encapsulant 22 formed on the chip carrier 20 with a cavity for exposing the chip attach region 202, wherein a groove 220 in association with beveled surfaces 222 are formed at a top 221 of the encapsulant 22; a photosensitive semiconductor chip 25 mounted on the chip attach region 202, and electrically connected to the chip carrier 20 by a plurality of gold wires 26; and a lid 23 applied with a thermally meltable adhesive 24 at a position corresponding to the top 221 of the encapsulant 22, so as to firmly attach the lid 23 to the encapsulant 22.

Figure 3A:
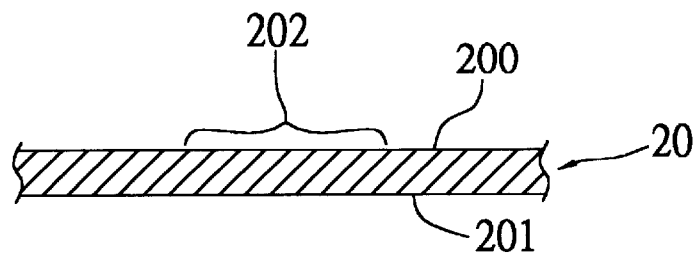
FIGS. 3A–3C are schematic diagrams showing the steps involved in fabricating a photosensitive semiconductor package of the invention.
Figure 3B:
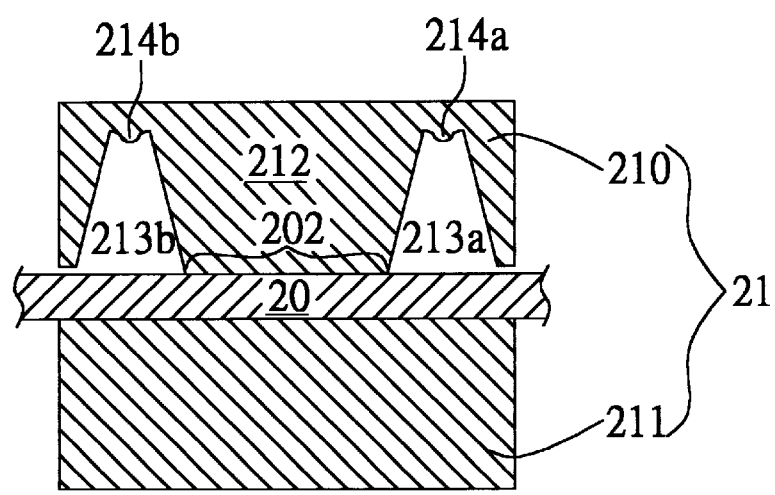
Figure 3C:
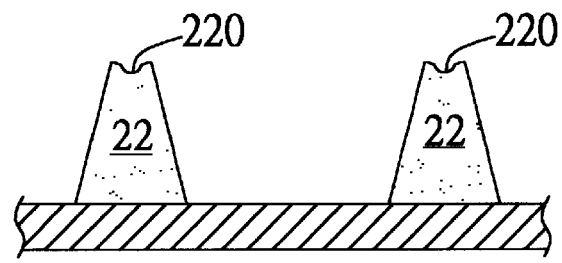

The fabricating processes of the photosensitive semiconductor package of the invention are described as follows with reference to FIGS. 3A to 3C. As shown in the drawings, a chip carrier 20 is a resin-made substrate made or a metallic lead frame, and has a front surface 200 and an opposing back surface 201, wherein a chip attach region 202 is pre-defined on the front surface 200 of the chip carrier 20 for chip bonding purpose. Thereafter, a particular encapsulating mold is used to clamp the chip carrier 20 therein for performing a molding process. This encapsulating mold 21 is composed of an upper mold 210 and a lower mold 211 engageable with the upper mold 210. The upper mold 210 is structured with a block 212 corresponding in position to the chip attach region 202 of the chip carrier 20, allowing a first cavity 213a and a second cavity 213b to be symmetrically formed at left and right sides of the block 212, respectively. Thereby, an encapsulant 22 formed by molding circularly surrounds the chip attach region 202 on the chip carrier 20. The encapsulating mold 21 is characterized in provision of tapered protrusions 214a, 214b extending downwardly from tops of the cavities 213a, 213b respectively, allowing a recessed groove 220 to be formed at a corresponding position at a top of the annular encapsulant 22.

Figure 4:
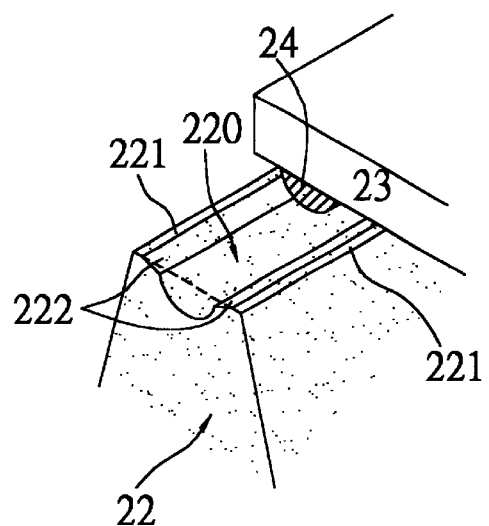
FIG. 4 is a magnified perspective view showing a bonding part between a lid and an encapsulant in a semiconductor package of the invention.
Figure 5:
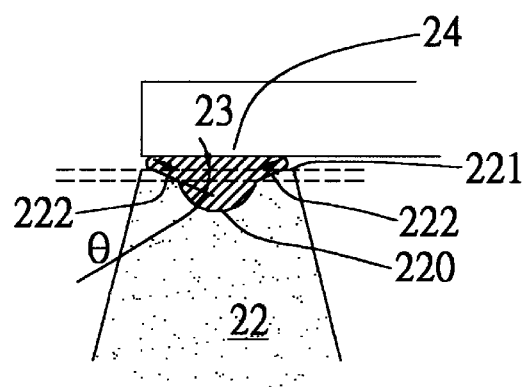
FIG. 5 is a cross-sectional view showing a bonding part between a lid and an encapsulant in a semiconductor package of the invention.
Figure 6:
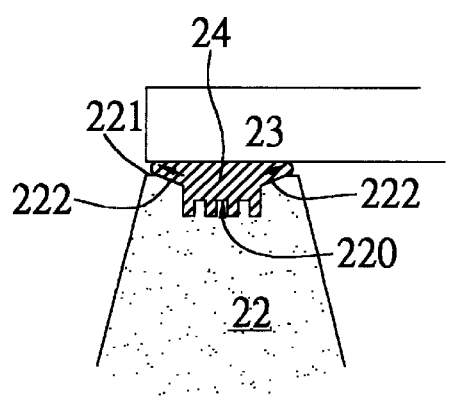
FIG. 6 is a cross-sectional view of another embodiment of a groove formed at an encapsulant in a semiconductor package of the invention.

FIG. 4 illustrates a perspective view of an encapsulant. As shown in the drawing, the encapsulant 22 has a top 221 to be connected to a lid 23, and the top 221 is formed at its two sides each with a beveled surface 222 that descends toward the center until reaching an recessed groove 220 at the top 221 of the encapsulant 22. As shown in FIG. 5, the beveled surface 222 is beveled by an angle of 0 to 5 degrees (as indicated by the θ angle) with respect to the top 221 of the encapsulant 22, according to different properties of an adhesive 24 applied on the lid 23. Alternatively, as shown in FIG. 6, the groove 220 can also be variably structured as a squared, curved or Vshaped groove, or even a groove made with protruding portions at a bottom thereof After a lid 23 is completely attached to the top 221 of the encapsulant 22 by the thermally molten adhesive 24, the groove 220 can temporarily retain excessive adhesive 24 therein in facility with the beveled surfaces 222 that effectively direct the adhesive flow toward the groove 222, so that undesirable adhesive loss and adhesive flash can be both prevented from occurrence. In addition, the beveled surfaces 222 are provided with relatively larger surface area for accommodating the adhesive 24, allowing contact area to be increased between the top 221 of the encapsulant 22 and the adhesive 24, thereby effectively improving the bonding between the lid 23 and the encapsulant 22.

Second Preferred Embodiment

Figure 7:
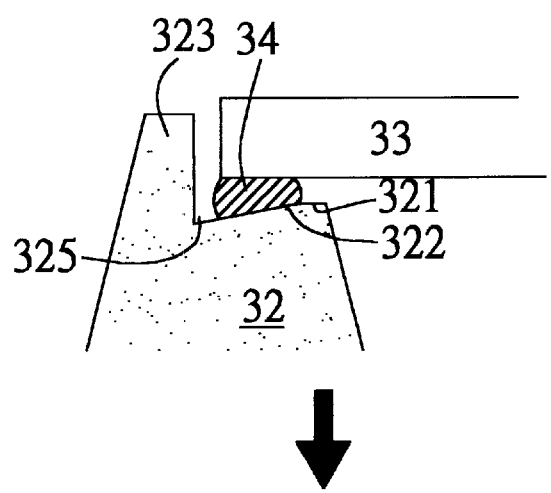
FIG. 7 is a schematic diagram showing a process of bonding a lid to an encapsulant in a second preferred embodiment of a semiconductor package of the invention.
Figure 7:
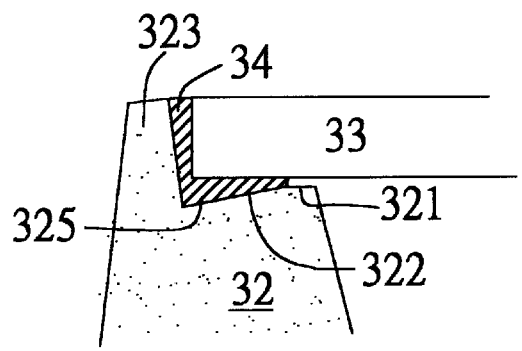

FIG. 7 illustrates a bonding part between an encapsulant and a lid in a photosensitive semiconductor package of a second preferred embodiment of the invention. The semiconductor package of the second embodiment is structurally similar to that of the first embodiment, with the only difference in this embodiment of forming a dam 323 at an outer edge of a top 321 of an encapsulant 32, wherein the dam 323 is dimensioned to be higher than a beveled surface 322, and associated with the beveled surface 322 to form a retaining space 325 angled less than 90 degrees for temporarily storing excessive molten adhesive 34, so as to eliminate the occurrence of adhesive flash over an outer side wall of the encapsulant 32 and well maintain the appearance of the semiconductor package, after a lid 33 is attached and pressed onto the encapsulant 32. Besides, the beveled surface 322 can effectively direct the adhesive flow toward the retaining space 325, thereby further preventing the adhesive 34 from flashing over an inner side wall of the encapsulant 32 in proximity to a chip attach area (not shown).

Third Preferred Embodiment

Figure 8:
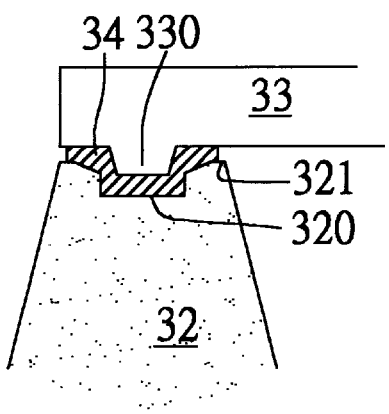
FIG. 8 is a cross-sectional view showing a bonding part between a lid and an encapsulant in a third preferred embodiment of a semiconductor package of the invention.

FIG. 8 illustrates a bonding part between an encapsulant and a lid in a photosensitive semiconductor package of a third preferred embodiment of the invention. The semiconductor package of the third embodiment is structurally similar to that of the first embodiment, with the only difference in this embodiment of forming a positioning portion 330 on a lid 33 at a position to be attached to a top 321 of the encapsulant 32, allowing the lid 33 to be firmly coupled via the positioning portion 330 to a groove 320 of the top 321 of the encapsulant 32. The provision of the positioning portion 330 increases the contact area between a molten adhesive 34 and the lid 33, so that the adherence between the lid 33 and the top 321 of the encapsulant 32 can be desirably strengthened.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package, comprising:
   a chip carrier, on which an encapsulant is formed with a cavity for exposing a portion of the chip carrier to outside of the encapsulant, wherein a top of the encapsulant is structured with a recessed portion and at least a beveled portion that descends toward the recessed portion and is associated with the recessed portion, wherein the beveled portion is beveled by an angle of 0 to 5 degrees with respect to the top of the encapsulant;
   at least a semiconductor chip mounted in the cavity and on the exposed portion of the chip carrier, and electrically connected to the chip carrier; and
   a lid attached to the top or the encapsulant by an adhesive, for hermetically covering the cavity of the encapsulant so as to isolate the semiconductor chip from external atmosphere.

2. The semiconductor package of claim 1, wherein the semiconductor package is a photoensitive semiconductor package.

3. The semiconductor package of claim 1, wherein the recessed portion is a curved groove.

4. The semiconductor package of claim 1, wherein the recessed portion is a V-shaped groove.

5. The semiconductor package of claim 1, wherein the recessed portion is a squared groove.

6. The semiconductor package of claim 1, wherein the recessed portion is a groove formed with at least a protruding part at a bottom thereof.

7. The semiconductor package of claim 1, wherein the lid is formed with at least a positioning portion to be coupled to the recessed portion.

8. The semiconductor package of claim 1, wherein the adhesive is a thermally meltable adhesive.

9. A semiconductor package, comprising:
- a chip carrier, on which an encapsulant is formed with a cavity for exposing a portion of the chip carrier to outside of the encapsulant, wherein a top of the encapsulant is structured with a protruding portion positioned at an outer edge of the encapsulant, and a beveled portion that is associated with the protruding portion to form a retaining space angled smaller than 90 degrees, wherein the protruding portion is dimensioned higher than the beveled portion by a height difference;
- at least a semiconductor chip mounted in the cavity and on the exposed portion or the chip carrier, and electrically connected to the chip carrier; and
- a lid attached to the top of the encapsulant by an adhesive, for hermetically covering the cavity of the encapsulant so as to isolate the semiconductor chip from external atmosphere.

10. The semiconductor package of claim 9, wherein the semiconductor package is a photosensitive semiconductor package.

11. The semiconductor package of claim 9, wherein the protruding portion is a dam.

12. The semiconductor package of claim 9, wherein the height difference is larger than thickness of the lid.

13. The semiconductor package of claim 9, wherein the beveled portion is beveled by an angle of 0 to 5 degrees with respect to the top of the encapsulant.

14. The semiconductor package of claim 9, wherein the adhesive is a thermally meltable adhesive.

15. A semiconductor package, comprising:
- a chip carrier, on which an encapsulant is formed with a cavity for exposing a portion of the chip carrier to outside of the encapsulant, wherein a top of the encapsulant is structured with a protruding portion positioned at an outer edge of the encapsulant, and a beveled portion that is associated with the protruding portion to form a retaining space angled smaller than 90 degrees, wherein the beveled portion is beveled by an angle of 0 to 5 degrees with respect to the top of the encapsulant;
- at least a semiconductor chip mounted in the cavity and on the exposed portion of the chip carrier, and electrically connected to the chip carrier; and
- a lid attached to the top of the encapsulant by an adhesive, for hermetically covering the cavity of the encapsulant so as to isolate the semiconductor chip from external atmosphere.

* * * * *